(12) United States Patent
Takahashi et al.

(10) Patent No.: US 8,709,277 B2
(45) Date of Patent: Apr. 29, 2014

(54) ETCHING COMPOSITION

(71) Applicants: Fujifilm Electronic Materials U.S.A., Inc., North Kingstown, RI (US); Fujifilm Corporation, Tokyo (JP)

(72) Inventors: Kazutaka Takahashi, Yaizu (JP); Atsushi Mizutani, Shizuoka (JP); Tomonori Takahashi, Mesa, AZ (US)

(73) Assignees: FUJIFILM Corporation, Tokyo (JP); Fujifilm Electronic Materials U.S.A., Inc., North Kingstown, RI (US)

( * ) Notice: Subject to any disclaimer, the term of this patent is extended or adjusted under 35 U.S.C. 154(b) by 0 days.

(21) Appl. No.: 13/827,861

(22) Filed: Mar. 14, 2013

(65) Prior Publication Data

US 2014/0073140 A1    Mar. 13, 2014

Related U.S. Application Data

(60) Provisional application No. 61/698,830, filed on Sep. 10, 2012.

(51) Int. Cl.
*C09K 13/00* (2006.01)

(52) U.S. Cl.
USPC ........................................ 252/79.1; 216/100

(58) Field of Classification Search
CPC ............ C09K 13/04; C23F 1/44; C23F 1/16; C23F 1/30; C23F 1/42
USPC ........................................ 252/79.1; 216/100
See application file for complete search history.

(56) References Cited

U.S. PATENT DOCUMENTS

| | | | |
|---|---|---|---|
| 4,271,965 A | 6/1981 | Brambley et al. |
| 4,285,761 A | 8/1981 | Fatula, Jr. et al. |
| 4,632,727 A | 12/1986 | Nelson |
| 4,804,438 A | 2/1989 | Rhodes |
| 4,944,851 A | 7/1990 | Cordani et al. |
| 5,232,563 A | 8/1993 | Warfield |
| 5,326,724 A | 7/1994 | Wei |
| 5,514,293 A | 5/1996 | Shimakura et al. |
| 5,591,354 A | 1/1997 | Patel et al. |
| 5,755,950 A | 5/1998 | Bell |
| 5,977,581 A | 11/1999 | Thakur et al. |
| 6,221,746 B1 | 4/2001 | Huang et al. |
| 6,407,047 B1 | 6/2002 | Mehta et al. |
| 6,494,960 B1 | 12/2002 | Macdonald et al. |

(Continued)

FOREIGN PATENT DOCUMENTS

| CN | 102290325 | 12/2011 |
|---|---|---|
| DE | 4100839 | 7/1992 |

(Continued)

OTHER PUBLICATIONS

International Search Report and the Written Opinion issued in International Application No. PCT/US12/28249 on Aug. 16, 2012.

(Continued)

*Primary Examiner* — Roberts Culbert
(74) *Attorney, Agent, or Firm* — Fish & Richardson P.C.

(57) ABSTRACT

This disclosure relates to an etching composition containing about 60% to about 95% of at least one sulfonic acid; about 0.005% to about 0.04% of chloride anion; about 0.03% to about 0.27% of bromide anion; about 0.1% to about 20% of nitrate or nitrosyl ion; and about 3% to about 37% of water.

39 Claims, 1 Drawing Sheet

(56) References Cited

U.S. PATENT DOCUMENTS

| | | |
|---|---|---|
| 6,630,433 B2 | 10/2003 | Zhang et al. |
| 6,703,291 B1 | 3/2004 | Boyanov et al. |
| 7,238,291 B2 | 7/2007 | Onsia et al. |
| 7,344,978 B2 | 3/2008 | Chang et al. |
| 7,517,765 B2 | 4/2009 | Brunco et al. |
| 7,790,624 B2 | 9/2010 | Sharma |
| 7,951,653 B1 | 5/2011 | Park et al. |
| 2001/0054706 A1 | 12/2001 | Levert et al. |
| 2003/0198889 A1 | 10/2003 | Iwasa et al. |
| 2004/0099637 A1 | 5/2004 | Johnson et al. |
| 2004/0169013 A1 | 9/2004 | Kool et al. |
| 2005/0050803 A1 | 3/2005 | Amanokura et al. |
| 2005/0070098 A1 | 3/2005 | Bruley et al. |
| 2005/0178742 A1 | 8/2005 | Chelle et al. |
| 2006/0051961 A1 | 3/2006 | Cabral, Jr. et al. |
| 2006/0201360 A1 | 9/2006 | Andriessen et al. |
| 2006/0226122 A1 | 10/2006 | Wojtczak et al. |
| 2007/0009449 A1 | 1/2007 | Kanca |
| 2007/0015360 A1 | 1/2007 | Lu et al. |
| 2007/0020925 A1 | 1/2007 | Hsieh et al. |
| 2007/0111356 A1 | 5/2007 | Wilson et al. |
| 2007/0161246 A1 | 7/2007 | Obeng et al. |
| 2008/0045035 A1 | 2/2008 | Lee et al. |
| 2008/0073614 A1 | 3/2008 | Akiyama et al. |
| 2008/0116170 A1 | 5/2008 | Collins et al. |
| 2008/0210900 A1 | 9/2008 | Wojtczak et al. |
| 2008/0274611 A1 | 11/2008 | Cabral et al. |
| 2009/0212021 A1 | 8/2009 | Bernhard et al. |
| 2009/0261291 A1 | 10/2009 | Banerjee et al. |
| 2009/0280641 A1 | 11/2009 | Kang et al. |
| 2009/0309228 A1 | 12/2009 | Fang et al. |
| 2010/0079924 A1 | 4/2010 | Keating et al. |
| 2010/0089872 A1 | 4/2010 | Ihara et al. |
| 2010/0261632 A1 | 10/2010 | Korzenski et al. |
| 2011/0146724 A1 | 6/2011 | Lee |
| 2012/0091100 A1 | 4/2012 | Bedell et al. |
| 2012/0231632 A1* | 9/2012 | Takahashi et al. ............ 438/754 |

FOREIGN PATENT DOCUMENTS

| | | | |
|---|---|---|---|
| DE | 100 39 684 | 5/2001 | ................ C23F 1/28 |
| DE | 102009045114 | 3/2011 | |
| KR | 2003-0004861 | 1/2003 | ............. C23C 18/16 |
| WO | WO 2012/017819 | 2/2012 | |
| WO | WO 2012/097143 | 7/2012 | |

OTHER PUBLICATIONS

International Search Report and Written Opinion issued in International Application No. PCT/US12/61355 on Dec. 27, 2012.
International Search Report and Written Opinion issued in International Application No. PCT/US2013/052863 dated Jan. 17, 2014 (13 pages).

\* cited by examiner

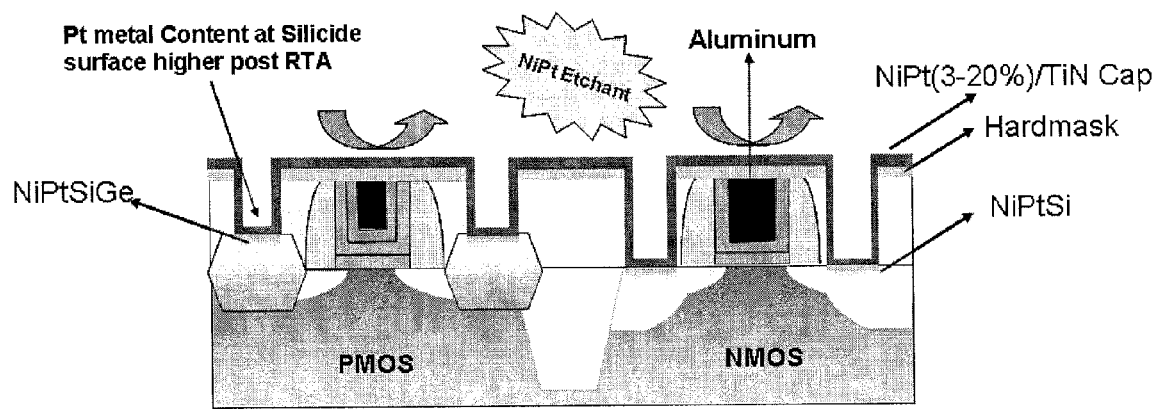

ETCHING COMPOSITION

CROSS-REFERENCE TO RELATED APPLICATION

This application claims priority to U.S. Provisional Application No. 61/698,830, filed on Sep. 10, 2012, the contents of which are hereby incorporated by reference in their entirety.

TECHNICAL FIELD OF THE DISCLOSURE

The present disclosure relates to semiconductor device manufacturing, and particularly to selective metal wet etching compositions and processes for selectively etching certain metals relative to adjacent structures and materials with those etching compositions. More particularly, the present disclosure relates to aqueous metal etching compositions and processes for etching nickel platinum in the presence of one or more of aluminum, nickel platinum silicides, and nickel platinum silicide germinides.

BACKGROUND OF THE DISCLOSURE

Integrated circuit manufacture is a multi-step construction process. The process entails repetitive steps of lithography to selectively expose underlying layers, etching of partially or completely exposed layers, and deposition of layers or filling of gaps frequently produced by etching or selective deposition of materials. Etching of metals is a critical process step. Frequently metals must be selectively etched in the presence of other metals, metal alloys, and/or non-metal materials without corroding, etching, or oxidizing the adjacent materials. As the dimensions of the features in the integrated circuit become increasingly smaller, the importance of minimizing corrosion, etching, oxidizing, or other damage to adjacent materials and features increases.

The structural features and compositions of the other metals, metal alloys, and non-metal materials may vary depending on the particular device so that prior art compositions may not etch the specific metal without damaging the materials in adjacent structures. Combinations of particular adjacent materials may also affect the type and amount of damage produced in an etching step. Thus it is often not obvious which etch composition is appropriate for a given device structure and adjacent materials. It is an objective of this disclosure to provide etching compositions which are suitable to selectively etch selected metals with little or no damage to adjacent materials and structures.

SUMMARY OF THE DISCLOSURE

This disclosure is based on the unexpected discovery that an etching composition containing at least one sulfonic acid, at least one chloride containing compound, at least one bromide containing compound, and at least one compound containing a nitrate or nitrosyl ion can significantly lower the amount of NiPtSi and/or NiPtSiGe oxidation compared to a conventional etching composition, while still maintaining a high NiPt etch rate. Such an etching composition can be used to manufacture, e.g., CMOS devices for microprocessors, microcontrollers, static RAM, and other digital logic circuits.

In one aspect, this disclosure features a composition for etching a metal film (e.g., a Ni or NiPt film). The etching composition contains A) about 60% to about 95% of at least one sulfonic acid, B) about 0.005% to about 0.04% of chloride anion from at least one chloride containing compound, C) about 0.03% to about 0.27% of bromide anion from at least one bromide containing compound, D) about 0.1% to about 20% of nitrate or nitrosyl ion from at least one compound containing a nitrate or nitrosyl ion, E) about 3% to about 37% water, and F) corresponding counter ions for the chloride, bromide and nitrate anions (or nitrosyl cation). Note that about 0.005%-0.04% of chloride anion equates to about $0.14 \times 10^{-2}$ moles/liter to about $1.13 \times 10^{-2}$ moles/liter of chloride anion and about 0.03%-0.27% bromide anion equates to about $0.38 \times 10^{-2}$ moles/liter to about $3.38 \times 10^{-2}$ moles/liter of bromide anion.

In some embodiments, the aqueous etching composition has a total chloride and bromide content ranging from about $1.1 \times 10^{-2}$ moles/liter to about $3.5 \times 10^{-2}$ moles/liter.

In some embodiments, the chloride and bromide contents in the etching composition meet the following equation:

$$[Cl^-]=[-0.221]\times[Br^-]+b,$$

in which $[Cl^-]$ refers to the chloride content in the unit of moles/liter, $[Br^-]$ refers to the bromide content in the unit of moles/liter, and b is a number ranging from $0.65 \times 10^{-2}$ moles/liter to $1.285 \times 10^{-2}$ moles/liter. In some embodiments, the chloride and bromide contents in the etching composition meet the equation above and the total chloride and bromide contents fall within the range of about $1.1 \times 10^{-2}$ moles/liter to about $3.5 \times 10^{-2}$ moles/liter.

Another aspect of this disclosure features a kit containing two, or optionally three, containers containing the ingredients that, when mixed in the proper proportions, yield a composition of this disclosure. In some embodiments, this disclosure concerns a kit containing, in two or optionally, three containers, the following reagents for forming an etching composition for microelectronic device manufacture: a) at least one sulfonic acid, b) at least one chloride containing compound, c) at least one bromide containing compound, d) at least one compound containing a nitrate or nitrosyl ion or mixtures thereof, and e) water, with the proviso that the at least one compound containing a nitrate or nitrosyl ion or mixtures thereof is in a different container than the at least one chloride containing compound and the at least one bromide containing compound.

In some embodiments, the kit contains at least one compound containing a chloride ion in a first container, at least one compound containing a nitrate or nitrosyl ion in a second container, and at least one compound containing a bromide ion in a third container. The second container is different from the first and third containers. In some embodiments, the first container can be same as the third container such that the at least chloride containing compound and the at least one bromide containing compound are in the same container. In other embodiments, the first container is different from the third container.

In still another aspect, this disclosure features a method that includes etching a metal film on a semiconductor substrate with the etching compositions mentioned herein; and rinsing the etched metal film with a rinse solvent. In some embodiments, the method includes (a) providing a semiconductor substrate having a metal film; (b) contacting the metal film with a composition of this disclosure, and (c) rinsing the etched semiconductor substrate with a solvent containing water.

BRIEF DESCRIPTION OF DRAWING

FIG. 1 is a representative illustration of a partially completed device just prior to removal of the TiN protective cap and the subsequent etch of NiPt using an etching composition described in this disclosure.

DETAILED DESCRIPTION OF THE DISCLOSURE

The numerical limits (i.e., the upper and lower limits) of the ranges and ratios described herein can be combined. The ranges described herein include all intermediate values within the ranges. In other words, all intermediate values within the ranges described herein are deemed to be disclosed by the disclosure of the ranges. All possible combinations of the various disclosed elements are deemed to be included within the scope of the present disclosure unless specifically excluded.

Unless otherwise stated, % is weight %. All temperatures are measured in Celsius degrees, unless otherwise stated.

The term "essentially free" in the context of this disclosure is defined to mean that none of the specified compounds is intentionally added to a formulation. The specified compounds, if present, are only contaminants in negligible amounts that would not materially affect the properties of a formulation.

Without wishing to be bound by theory, it is believed that the nitrate source on reaction with the chloride and/or bromide source in a strongly acidic environment forms the oxidizing NO (nitrosyl) chloride and/or bromide intermediate. The nitrosyl cation oxidizes the metals and the free chloride and/or bromide ions ionized in the aqueous composition complex the metal ions and assist in their dissolution. The soluble metal salts are believed to be coordination compounds with chloride and/or bromide in the coordination sphere. The water is believed to solubilize the inorganic metal salts.

Although using a large amount of a nitrate source (e.g., nitric acid) or a halide source (e.g., hydrochloric acid) can provide sufficient acidity to the etching composition, it can overly oxidize the materials (e.g., NiPtSi, NiPtSiGe) adjacent to the NiPt film, thereby damaging the adjacent features. The sulfonic acids are used to maintain a low pH for effective formation of the nitrosyl halide at low concentrations of halide and nitrate, and for assistance in dissolution of the metal salts. However, some oxidation still occurs and a decrease in the amount of oxidation is still desired. In addition, the oxidative characteristics of different materials can be different, presenting difficulties in obtaining concurrent decreases in oxidation without unacceptably low NiPt etch rates.

The inventors have surprisingly discovered that the use of specific ratios of both Cl and Br in low concentrations in NiPt etch solutions, can significantly decrease the degree of oxidation of both NiPtSi and NiPtSiGe concurrently, while producing NiPt etch rates similar to or higher than those achievable by conventional formulations.

In some embodiments, this disclosure concerns an etching composition containing A) at least one sulfonic acid, B) about 0.005% to about 0.04% of chloride anion from at least one chloride containing compound, C) about 0.03% to about 0.27% of bromide anion from at least one bromide containing compound, D) nitrate or nitrosyl ions from at least one compound containing a nitrate or nitrosyl ion, E) water, and F) corresponding counter ions for the chloride, bromide, and nitrate anions (or nitrosyl cation).

In some embodiments, the etching composition contains A) about 60% to about 95% of at least one sulfonic acid, B) about 0.005% to about 0.04% of chloride anion from at least one chloride containing compound, C) about 0.03% to about 0.27% of bromide anion from at least one bromide containing compound, D) about 0.1% to about 20% of a nitrate or nitrosyl ion from at least one compound containing a nitrate or nitrosyl ion, E) about 3% to about 37% water, and F) corresponding counter ions for the chloride, bromide and nitrate anions (or nitrosyl cation).

Two or more sulfonic acids may be employed in the etching compositions of this disclosure. The sulfonic acids may be a solid or a liquid at room temperature as long as the final composition is a homogeneous liquid. In general, liquid or low melting solid sulfonic acids work effectively.

Preferred sulfonic acids are described by $R^1SO_3H$ (Formula (1)) or by Formula (2) below. In Formula (1), $R^1$ can be substituted or unsubstituted $C_1$-$C_{12}$ linear or branched alkyl, substituted or unsubstituted $C_3$-$C_{12}$ cyclic alkyl, $C_1$-$C_{12}$ linear or branched perfluoroalkyl, $C_3$-$C_{12}$ cyclic perfluoroalkyl, $C_1$-$C_{12}$ linear or branched fluoroalkyl ether, $C_3$-$C_{12}$ cyclic fluoroalkyl ether, or substituted or unsubstituted $C_7$-$C_{12}$ alicyclic. Examples of substituents include $C_1$-$C_4$ alkyl groups, sulfonic acid groups, phenyl groups, $C_1$-$C_4$ alkylphenyl groups, hydroxyphenyl groups, and halogen (e.g., fluorine). In Formula (2), $R^2$, $R^3$, and $R^4$ are independently selected from the group consisting of $C_1$-$C_{12}$ linear or branched alkyl, $C_3$-$C_{12}$ cyclic alkyl, Cl, Br, F, OH, $NO_2$, $SO_3H$, and $CO_2H$; $R^5$=H; and a, b, c, and n are integers selected from the group consisting of 0, 1, 2, and 3 with the relationship a+b+c=n.

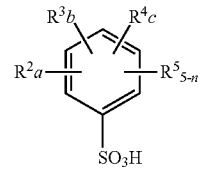

Formula (2)

In some embodiments, preferred sulfonic acids of Formula (1) are those wherein $R^1$ is substituted or unsubstituted $C_1$-$C_4$ linear or branched alkyl, $C_1$-$C_4$ linear or branched perfluoroalkyl, $C_4$-$C_6$ linear or branched fluoroalkyl ether, and substituted or unsubstituted $C_7$-$C_{10}$ alicyclic groups.

In some embodiments, more preferred sulfonic acids of Formula (1) are those wherein $R^1$ is substituted or unsubstituted $C_1$-$C_4$ linear or branched alkyl or $C_1$-$C_4$ linear or branched perfluoroalkyl.

In some embodiments, the most preferred sulfonic acids of Formula (1) are those wherein $R^1$ is substituted or unsubstituted $C_1$-$C_2$ alkyl or $C_1$-$C_2$ perfluoroalkyl.

In some embodiments, preferred sulfonic acids of Formula (2) are those wherein $R^2$, $R^3$, and $R^4$ are $C_1$-$C_4$ linear or branched alkyl, Cl, $NO_2$, OH, $SO_3H$, F, and $CO_2H$, where n is an integer selected from the group consisting of 0, 1 and 2.

In some embodiments, more preferred sulfonic acids of Formula (2) are those wherein $R^2$, $R^3$, and $R^4$ are $C_1$-$C_4$ linear or branched alkyl, $C_1$, $NO_2$, OH, $SO_3H$, F, and $CO_2H$, where n is an integer selected from the group consisting of 0 and 1.

In some embodiments, the most preferred sulfonic acids of Formula (2) are those wherein $R^2$, $R^3$, and $R^4$ are $C_1$-$C_2$ alkyl, $C_1$, $NO_2$, OH, F, and $CO_2H$, where n is an integer selected from the group consisting of 0 and 1.

Examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, butanesulfonic acid, perfluorobutanesulfonic acid, propanesulfonic acid, perfluoropropanesulfonic acid, octylsulfonic acid, pefluorooctanesulfonic acid, methanedisulfonic acid, 2-methylpropanesulfonic acid, cyclohexylsulfonic acid, camphorsulfonic acids, perfluorohexanesulfonic acid, ethanedisulfonic acid, benzylsulfonic acid, hydroxyphenylmethanesulfonic acid, naphthylmethanesulfonic acid, and norbornanesulfonic acids.

In some embodiments, preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, butanesulfonic acid, perfluorobutanesulfonic acid, propanesulfonic acid, perfluoropropanesulfonic acid, methanedisulfonic acid, 2-methylpropanesulfonic acid, camphorsulfonic acids, ethanedisulfonic acid, benzylsulfonic acid, hydroxyphenylmethanesulfonic acid, naphthylmethanesulfonic acid, and norbornanesulfonic acids.

In some embodiments, more preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, butanesulfonic acid, perfluorobutanesulfonic acid, propanesulfonic acid, perfluoropropanesulfonic acid, methanedisulfonic acid, 2-methylpropanesulfonic acid, ethanedisulfonic acid, benzylsulfonic acid, hydroxyphenylmethanesulfonic acid, and naphthylmethanesulfonic acid.

In some embodiments, the most preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, methanedisulfonic acid, and ethanedisulfonic acid.

Examples of sulfonic acids of Formula (2) include, but are not limited to, benzenesulfonic acid, chlorobenzenesulfonic acids, bromobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids, methylchlorobenzenesulfonic acids, dodecylbenzenesulfonic acids, butylbenzenesulfonic acids, cyclohexylbenzenesulfonic acids, dichlorobenzenesulfonic acids, dibromobenzenesulfonic acids, and 2,4,5-trichlorobenzenesulfonic acid.

In some embodiments, preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids, methylchlorobenzenesulfonic acids, butylbenzenesulfonic acids, and dichlorobenzenesulfonic acids.

In some embodiments, more preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, benzenedisulfonic acids, toluenesulfonic acids, and butylbenzenesulfonic acids.

In some embodiments, more preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, and toluenesulfonic acids.

In some embodiments, the at least one sulfonic acid includes a mixture of one or more of a first sulfonic acid and one or more of a second sulfonic acid having higher hydrophobicity than the at least one first sulfonic acid. Without wishing to be bound by theory, it is believed that adding a second sulfonic acid having a higher hydrophobicity than the first sulfonic acid to the etching compositions described herein can help protect the surfaces of the materials neighboring NiPt in a device and can reduce oxidation of these materials (e.g., NiPtSi). The first sulfonic acid can be selected from the group consisting of acids of Formula (1): $R^1SO_3H$, where $R^1$ is an unsubstituted $C_1$-$C_4$ linear or branched alkyl.

The second sulfonic acid can be selected from the group consisting of sulfonic acids of formula (2):

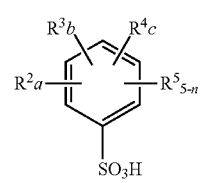

Formula (2)

where $R^2$, $R^3$, and $R^4$ are independently selected from the group consisting of $C_1$-$C_{12}$ linear or branched alkyl, $C_3$-$C_{12}$ cyclic alkyl, Cl, Br, F; $R^5$ is H; and a, b, c, and n are integers selected from the group consisting of 0, 1, 2, and 3 with the relationship a+b+c=n.

The second sulfonic acid can also be a compound of Formula (1): $R^1SO_3H$, where $R^1$ is substituted or unsubstituted $C_6$-$C_{12}$ linear or branched alkyl, substituted or unsubstituted $C_6$-$C_{12}$ cyclic alkyl, $C_1$-$C_{12}$ linear or branched perfluoroalkyl, $C_3$-$C_{12}$ cyclic perfluoroalkyl, $C_1$-$C_{12}$ linear or branched fluoroalkyl ether, $C_3$-$C_{12}$ cyclic fluoroalkyl ether, or substituted or unsubstituted $C_7$-$C_{12}$ alicyclic groups. Examples of substituents include, but are not limited to, $C_1$-$C_4$ alkyl groups, phenyl groups, and fluorine atoms. In such embodiments, hydrophilic groups (e.g., OH, COOH, $SO_3H$, or $NO_2$) are excluded as substituents suitable for the second sulfonic acid.

Examples of the first sulfonic acids of Formula (1) include, but are not limited to, methanesulfonic acid, ethanesulfonic acid, propanesulfonic acid, and butanesulfonic acid.

Examples of the second sulfonic acids of Formula (2) include, but are not limited to, benzenesulfonic acid, chlorobenzenesulfonic acids, bromobenzenesulfonic acids, fluorobenzenesulfonic acids, toluenesulfonic acids, methylchlorobenzenesulfonic acids, dodecylbenzenesulfonic acids, butylbenzenesulfonic acids, cyclohexylbenzenesulfonic acids, dichlorobenzenesulfonic acids, dibromobenzenesulfonic acids, and 2,4,5-trichlorobenzenesulfonic acid.

Other sulfonic acids suitable as the second sulfonic acid include, but are not limited to, trifluoromethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, perfluorobutanesulfonic acid, perfluoropropanesulfonic acid, octylsulfonic acid, pefluorooctanesulfonic acid, cyclohexylsulfonic acid, camphorsulfonic acids, perfluorohexanesulfonic acid, benzylsulfonic acid, naphthylmethanesulfonic acid, and norbornanesulfonic acid, Preferred sulfonic acids suitable as the second sulfonic acid are those of Formula (1) where $R^1$ is $C_1$-$C_{12}$ linear or branched perfluoroalkyl and those of Formula (2) where $R^2$ is $C_1$-$C_{12}$ linear or branched alkyl, a is 1, and b and c are 0.

In some embodiments, the at least one sulfonic acid is a naphthalenesulfonic acid, which is optionally substituted with a $C_1$-$C_{12}$ linear or branched alkyl group or $SO_3H$. Examples of substituted or unsubstituted naphthalenesulfonic acid include, but are not limited to, 1-naphthalenesulfonic acid, 2-naphthalenesulfonic acid, 8-methyl-1-napthalenesulfonic acid, 5-methyl-2-napthalenesulfonic acid, 3-methyl-2-napthalenesulfonic acid, 4-methyl-1- napthalenesulfonic acid, and 1,5-naphthalenedisulfonic acid. In some embodiments, the at least one sulfonic acid is a mixture of one or more of the first sulfonic acid of Formula (1) described above and one or more of a second sulfonic acid in which the second sulfonic acid is a naphthalenesulfonic acid optionally substituted with a $C_1$-$C_{12}$ linear or branched alkyl group.

In some embodiments, the at least one sulfonic acid is an anthracenesulfonic acid, which is optionally substituted with a $C_1$-$C_{12}$ linear or branched alkyl group or $SO_3H$. Examples of substituted or unsubstituted anthracenesulfonic acid include, but are not limited to, 1-anthracenesulfonic acid, 2-anthracenesulfonic acid, 9-anthracenesulfonic acid, and 9,10-anthracenedisulfonic acid. In some embodiments, the at least one sulfonic acid is a mixture of one or more of the first sulfonic acid of Formula (1) described above and one or more of a second sulfonic acid in which the second sulfonic acid is an anthracenesulfonic acid, which is optionally substituted with a $C_1$-$C_{12}$ linear or branched alkyl group.

In some embodiments, the first sulfonic acid and the second sulfonic acid are employed in a ratio of from about 10:1 to about 150:1. In some embodiments, the first sulfonic acid and the second sulfonic acid are employed in a ratio of from about 20:1 to about 60:1. In some embodiments, the first sulfonic acid and the second sulfonic acid are employed in a ratio of from about 30:1 to about 40:1.

Performance of the etching compositions described herein can be optimized based on the specific metals present on the device being etched, and the relative hydrophobicity and acidity of the first and second sulfonic acids being employed.

The etching compositions of this disclosure employ at least one chloride containing compound and at least one bromide containing compound. Unexpectedly, it was found that an etching composition containing a mixture of chloride and bromide anions could maintain or even increase the NiPt etch rate while decreasing the amount of NiPtSi or NiPtSiGe oxidation.

In some embodiments, the etching compositions can include two or more chloride containing compounds as sources of chloride anions and/or two or more bromide containing compounds as sources of bromide anions. When a mixture of chloride (or bromide) containing compounds is used, they can belong to the same class of compounds or different classes of compounds.

Any suitable source of ionic chloride and bromide compounds may be employed in the compositions of this disclosure. Care should be taken that the chloride and bromide do not contain groups unstable to the strong acid conditions. Suitable sources of ionic chloride include, but are not limited to, hydrogen chloride, ammonium chloride, quaternary ammonium chlorides, amine hydrochlorides, nitrogen based aromatic and pseudoaromatic hydrochlorides, and metal chlorides.

In some embodiments, preferred sources of ionic chlorides include, but are not limited to, hydrogen chloride, ammonium chloride, quaternary ammonium chlorides, amine hydrochlorides, and nitrogen based aromatic and pseudoaromatic hydrochlorides.

In some embodiments, more preferred sources of ionic chlorides include, but are not limited to, hydrogen chloride, ammonium chloride, quaternary ammonium chlorides, and nitrogen based aromatic and pseudoaromatic hydrochlorides.

In some embodiments, the most preferred sources of ionic chlorides include, but are not limited to, hydrogen chloride, ammonium chloride, and quaternary ammonium chlorides.

Examples of quaternary ammonium chlorides include, but are not limited to, those compounds described by $R^1R^2R^3R^4N^+Cl^-$ where $R^1$, $R^2$, $R^3$, and $R^4$ independently are substituted or unsubstituted alkyl or phenyl. Examples of $R^1$, $R^2$, $R^3$, and $R^4$ include, but are not limited to, methyl, ethyl, propyl, butyl, pentyl, octyl, decyl, and phenyl. Examples of substituents include, but are not limited to, fluoride, $C_1$-$C_4$ alkyl, and substituted or unsubstituted phenyl. Preferred quaternary ammonium chlorides are those where $R^1$, $R^2$, $R^3$, and $R^4$ are $C_1$-$C_4$ alkyl. More preferred quaternary ammonium chlorides are those where $R^1$, $R^2$, $R^3$, and $R^4$ are $C_1$-$C_2$ alkyl.

Specific examples of quaternary ammonium chlorides include, but are not limited to, tetramethylammonium chloride, ethyltrimethylammonium chloride, diethyldimethyl ammonium chloride, methyltriethylammonium chloride, tetraethylammonium chloride, phenyltrimethyl ammonium chloride, dimethyldiphenylammonium chloride, benzyl trimethylammonium chloride, tetrapropylammonium chloride, tetrabutylammonium chloride, dimethyldibutylammonium chloride, decyltrimethylammonium chloride, pentyltrimethylammonium chloride, tetra-isopropylammonium chloride, decyltrimethylammonium chloride, 2,2,2-trifluoroethyltrimethylammonium chloride, fluorophenyl trimethyl ammonium chloride, chlorophenyltrimethylammonium chloride, and methylphenyltrimethylammonium chloride. Tetramethylammonium chloride, tetraethylammonium chloride, methyltriethylammonium chloride, ethyltrimethylammonium chloride are preferred from this class of chlorides.

Examples of amine hydrochlorides include, but are not limited to, the reaction products of HCl with mono-, di-, and trisubstituted amine compounds, which contain 1 or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic hydrochlorides, include, but are not limited to, the reaction products of HCl with pyridine, pyrrole, pyrazole, imidazole, pyrazine, pyrimidine, and their substituted derivatives.

Examples of metal chlorides include sodium chloride, potassium chloride, lithium chloride, copper chloride, iron chloride, magnesium chloride, nickel chloride, palladium chloride, platinum chloride, tin chloride, and zinc chloride. For example, the chlorides of the specific metal being etched may be added in a buffering approach. The metal chloride may provide some small equilibrium amount of unbound chloride.

Suitable sources of ionic bromide include, but are not limited to, hydrogen bromide, ammonium bromide, quaternary ammonium bromides, amine hydrobromides, nitrogen based aromatic and pseudoaromatic hydrobromides, and metal bromides.

In some embodiments, preferred sources of ionic bromides include, but are not limited to, hydrogen bromide, ammonium bromide, quaternary ammonium bromides, amine hydrobromides, and nitrogen based aromatic and pseudoaromatic hydrobromides.

In some embodiments, more preferred sources of ionic bromides include, but are not limited to, hydrogen bromide, ammonium bromide, quaternary ammonium bromides, and nitrogen based aromatic and pseudoaromatic hydrobromides.

In some embodiments, the most preferred sources of ionic bromides include, but are not limited to, hydrogen bromide, ammonium bromide, and quaternary ammonium bromides.

Examples of quaternary ammonium bromides include, but are not limited to, those compounds described by $R^1R^2R^3R^4N^+Br^-$ where $R^1$, $R^2$, $R^3$, and $R^4$ independently are substituted or unsubstituted alkyl or phenyl. Examples of $R^1$, $R^2$, $R^3$, and $R^4$ include, but are not limited to, methyl, ethyl, propyl, butyl, pentyl, octyl, decyl, and phenyl. Examples of substituents include, but are not limited to, fluoride, $C_1$-$C_4$ alkyl, and substituted or unsubstituted phenyl. Preferred quaternary ammonium bromides are those where $R^1$, $R^2$, $R^3$, and $R^4$ are $C_1$-$C_4$ alkyl. More preferred quaternary ammonium bromides are those where $R^1$, $R^2$, $R^3$, and $R^4$ are $C_1$-$C_2$ alkyl.

Specific examples of quaternary ammonium bromides include, but are not limited to, tetramethylammonium bromide, methyltriethylammonium bromide, diethyldimethyl ammonium bromide, ethyltrimethylammonium bromide, tetraethylammonium bromide, phenyltrimethyl ammonium bromide, dimethyldiphenylammonium bromide, benzyl trimethylammonium bromide, tetrapropylammonium bromide, tetrabutylammonium bromide, dimethyldibutylammonium bromide, decyltrimethylammonium bromide, pentyltrimethylammonium bromide, tetra-isopropylammonium bromide, decyltrimethylammonium bromide, 2,2,2-trifluoroethyltrimethylammonium bromide, fluorophenyl trimethyl ammonium bromide, chlorophenyltrimethylammonium bromide, and methylphenyltrimethylammonium bromide. Tetramethylammonium bromide, tetraethylammonium bromide, methyltriethylammonium bromide, ethyltrimethylammonium bromide are preferred from this class of bromides.

Examples of hydrobromides include, but are not limited to, the reaction products of HBr with mono-, di-, and trisubstituted amine compounds, which contain 1 or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic hydrobromides, include, but are not limited to, the reaction products of HBr with pyridine, pyrrole, pyrazole, imidazole, pyrazine, pyrimidine, and their substituted derivatives.

Examples of metal bromides include sodium bromide, potassium bromide, lithium bromide, copper bromide, iron bromide, magnesium bromide, nickel bromide, palladium bromide, platinum bromide, tin bromide, and zinc bromide. For example, the bromides of the specific metal being etched may be added in a buffering approach. The metal bromide may provide some small equilibrium amount of unbound bromide.

The etching compositions of this disclosure employ one or more sources of nitrate or nitrosyl ions. The one or more nitrates may be employed from the same or different classes. Similarly, one or more nitrosyl salts from the same or different classes may be employed. Alternatively, a mixture(s) of nitrate(s) and nitrosyl salt(s) from the same or different classes may be employed.

Any suitable source of ionic nitrate anions or nitrosyl salts may be employed in the compositions of this disclosure. Suitable ionic nitrate sources include, but are not limited to, nitric acid, ammonium nitrate, quaternary ammonium nitrates, substituted ammonium nitrates, nitrogen based aromatic and pseudoaromatic reaction products with nitric acid, and metal nitrates.

In some embodiments, preferred sources of ionic nitrate and nitrosyl salts include, but are not limited to, nitric acid, ammonium nitrate, quaternary ammonium nitrates, nitrogen based aromatic and pseudoaromatic reaction products with nitric acid. More preferred sources of ionic nitrate and nitrosyl salts include, but are not limited to, nitric acid, ammonium nitrate, and quaternary ammonium nitrates. The most preferred sources of ionic nitrate are nitric acid and ammonium nitrate.

Specific examples of quaternary ammonium nitrates include, but are not limited to, tetramethylammonium nitrate, ethyltrimethylammonium nitrate, diethyldimethyl ammonium nitrate, methyltriethylammonium nitrate, tetraethylammonium nitrate, phenyltrimethyl ammonium nitrate, dimethyldiphenylammonium nitrate, benzyl trimethylammonium nitrate, tetrapropylammonium nitrate, tetrabutylammonium nitrate, dimethyldibutylammonium nitrate, decyltrimethylammonium nitrate, pentyltrimethylammonium nitrate, tetra-isopropylammonium nitrate, decyltrimethylammonium nitrate, 2,2,2-trifluoroethyltrimethylammonium nitrate, fluorophenyl trimethyl ammonium nitrate, chlorophenyltrimethylammonium nitrate, and methylphenyltrimethylammonium nitrate. Tetramethylammonium nitrate, tetraethylammonium nitrate, methyltriethylammonium nitrate, ethyltrimethylammonium nitrate are preferred from this class of nitrates.

Examples of substituted ammonium nitrates include, but are not limited to, the reaction products of nitric acid with mono-, di-, and trisubstituted amine compounds, which contain 1 or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic reaction products with nitric acid, include, but are not limited to, the reaction products of nitric acid with pyridine, pyrole, pyrazole, imidazole, pyrazine, pyrimidine, and their substituted derivatives.

Examples of metal nitrates include sodium nitrate, potassium nitrate, lithium nitrate, copper nitrates, iron nitrates, magnesium nitrate, nickel nitrate, palladium nitrate, platinum nitrate, tin nitrate, and nitrate.

Suitable nitrosyl salts include nitrosyl chloride, nitrosyl bromide, nitrosyl fluoride, nitrosyl tetrafluoroborate, and nitrosyl hydrogen sulfate. Nitrosyl hydrogen sulfate and nitrosyl tetrafluoroborate are preferred. Nitrosyl hydrogen sulfate is more preferred.

Water (preferably deionized water), cations for the nitrate, chloride, and bromide, anions for the nitrosyl, and optional additives complete the etching composition of this disclosure. Water is at least about 3% of the etching composition so that the etching occurs and the products are dissolved in the etching composition. The water source may be from the sulfonic acid, the chloride or bromide source, the nitrate source, or added additionally to any water provided by those sources. In some embodiments, water is at most about 37% of the etching composition.

In some embodiments of the disclosure, the aqueous etching composition is essentially free of fluoride anions (i.e., $F^-$) or inorganic fluoride ion sources. In some embodiments of the disclosure, the aqueous etching composition is essentially free of abrasives. In some embodiments of the disclosure, the aqueous etching composition is essentially free of both fluoride anions and abrasives. In some embodiments of the disclosure, the aqueous etching composition is essentially free of aromatic nitro compounds, and/or thiocarbonyl compounds, and/or metal ions (except for those metals being etched). In some embodiments of the disclosure, the aqueous etching composition is essentially free of metal ions. In some embodiments of the disclosure, the aqueous etching composition of the disclosure is essentially free of other mineral acids (e.g. sulfuric, phosphoric, hydrogen iodide, and hydrogen fluoride). In some embodiments of the disclosure, the aqueous etching composition of the disclosure is essentially free of additional oxidizing compounds (e.g. hydrogen peroxide). In some embodiments of the disclosure, the aqueous etching composition of the disclosure is essentially free of surfactants and/or carboxylic acids, and or azole compounds. In some embodiments of the disclosure, the aqueous etching composition of the disclosure is essentially free of one or more of the above listed situations.

In some embodiments, the sulfonic acid is about 60%-95% of the aqueous etching composition. In some embodiments, the sulfonic acid is about 60%-85% of the aqueous etching composition. In some embodiments, the sulfonic acid is about 60%-80% of the aqueous etching composition described herein. In some embodiments, the sulfonic acid is about 60%-75% of the aqueous etching composition. In some embodiments, the sulfonic acid is about 65%-95% (e.g., about 70%-95%, about 75%-95%, about 80%-95%, about 85%-95%, or about 90%-95%) of the aqueous etching composition.

In some embodiments, the chloride anion is about 0.005% to about 0.04% of the aqueous etching composition described herein. In some embodiments, the chloride anion is about 0.005% to about 0.035% of the aqueous etching composition. In some embodiments, the chloride anion is about 0.01% to about 0.035% of the aqueous etching composition. In some embodiments, the chloride anion is about 0.01% to about 0.03% of the aqueous etching composition.

In some embodiments, the bromide anion is about 0.03% to about 0.27% of the aqueous etching composition described herein. In some embodiments, the bromide anion is about 0.05% to about 0.27% of the aqueous etching composition. In some embodiments, the bromide anion is about 0.05% to about 0.25% of the aqueous etching composition. In some embodiments, the bromide anion is about 0.05% to about 0.22% of the aqueous etching composition.

In some embodiments, the chloride anion is from about 0.005% to about 0.04% (e.g., from about 0.005% to about 0.035%, from about 0.01% to about 0.035%, or from about 0.01% to about 0.03%) of the aqueous etching composition, the bromide content is from about 0.03% to about 0.27% (e.g., from about 0.05% to about 0.27%, from about 0.05% to about 0.25%, or from about 0.05% to about 0.22%) of the aqueous etching composition, and the total chloride and bromide contents are from about $1.1 \times 10^{-2}$ moles/liter to about $3.5 \times 10^{-2}$ moles/liter in the aqueous etching composition. Preferably, the total chloride and bromide contents are from $1.3 \times 10^{-2}$ moles/liter to $3.5 \times 10^{-2}$ moles/liter. More preferably, the total chloride and bromide contents are from $1.3 \times 10^{-2}$ moles/liter to $3.4 \times 10^{-2}$ moles/liter.

Without wishing to be bound by theory, it is believed that, when the total chloride and bromide contents range from about $1.1 \times 10^{-2}$ moles/liter to about $3.5 \times 10^{-2}$ moles/liter in the aqueous etching composition, the etching composition can exhibit better performance (e.g., decreasing the amount of NiPtSi and/or NiPtSiGe oxidation while still maintaining a high NiPt etch rate) than a composition containing the total chloride and bromide contents outside the above range. For example, a composition containing the total chloride and bromide contents outside the above range can have either a relatively low NiPt etch rate or a relatively large amount of NiPtSi and/or NiPtSiGe oxidation.

In some embodiments, the chloride anion is from about 0.005% to about 0.04% (e.g., from about 0.005% to about 0.035%, from about 0.01% to about 0.035%, or from about 0.01% to about 0.03%) of the aqueous etching composition, the bromide content is from about 0.03% to about 0.27% (e.g., from about 0.05% to about 0.27%, from about 0.05% to about 0.25%, or from about 0.05% to about 0.22%) of the aqueous etching composition, the total chloride and bromide contents are from about $1.1 \times 10^{-2}$ moles/liter to about $3.5 \times 10^{-2}$ moles/liter, and the chloride and bromide contents in the etching composition meet the following equation:

$$[Cl^-]=[-0.221]\times[Br^-]+b,$$

in which $[Cl^-]$ refers to the chloride content in the unit of moles/liter, $[Br^-]$ refers to the bromide content in the unit of moles/liter, and b is a number ranging from $0.65 \times 10^{-2}$ moles/liter to $1.285 \times 10^{-2}$ moles/liter. Preferably, b is a number ranging from $0.7 \times 10^{-2}$ moles/liter to $1.285 \times 10^{-2}$ moles/liter. More preferably, b is a number ranging from $0.7 \times 10^{-2}$ moles/liter to $1.2 \times 10^{-2}$ moles/liter. Most preferably, b is a number ranging from $0.75 \times 10^{-2}$ moles/liter to $1.2 \times 10^{-2}$ moles/liter.

Without wishing to be bound by theory, it is believed that, when the total chloride and bromide contents are from about $1.1 \times 10^{-2}$ moles/liter to about $3.5 \times 10^{-2}$ moles/liter in the aqueous etching composition and the chloride and bromide contents in the etching composition meet the equation described in the preceding paragraph, the etching composition can exhibit better performance (e.g., decreasing the amount of NiPtSi and/or NiPtSiGe oxidation while still maintaining a high NiPt etch rate) than a composition that does not meet the above conditions.

In some embodiments, the nitrate or nitrosyl ion is about 0.1% to about 20% of the aqueous etching composition described herein. In some embodiments, the nitrate or nitrosyl ion is about 0.5% to about 10% of the aqueous etching composition. In some embodiments, the nitrate or nitrosyl ion is about 0.5% to about 5% of the aqueous etching composition. In some embodiments, the nitrate or nitrosyl ion is about 0.5% to about 2.5% of the aqueous etching composition.

In some embodiments, the nitrate or nitrosyl ion is about 2.5% to about 7% (e.g., about 2.5% to about 6% or about 3% to about 5%) of the aqueous etching composition.

In some embodiments, the water is about 3% to about 37% of the aqueous etching composition described herein. In some embodiments, the water is about 10% to about 35% of the aqueous etching composition. In some embodiments, the water is about 15% to about 35% of the aqueous etching composition. In some embodiments, the water is about 20% to about 35% of the aqueous etching composition.

In some embodiments, the aqueous etching composition contains A) about 60% to about 95% (e.g., about 60% to about 90%, about 60% to about 85%, about 60% to about 80%, 60% to about 75%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.1% to about 20% (e.g., about 0.5% to about 10%, about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation).

In some embodiments, the aqueous etching composition contains A) about 60% to about 90% (e.g., about 60% to about 85%, about 60% to about 80%, 60% to about 75%, about 65% to about 90%, about 65% to about 80%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion E) about 3% to about 37% (e.g., about 10% to about 35% or about 15 to about 35% or about 20 to about 35%) water, and F) corresponding counter ions for the chloride, bromide and nitrate anions (or nitrosyl cation).

In some embodiments, the aqueous etching composition contains A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation).

In some embodiments, the aqueous etching composition contains A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.01% to about 0.35% (e.g., about 0.01% to about 0.03%) of chloride anion from at least one chloride containing compound, C) about 0.05% to about 0.25% (e.g., about 0.05% to about 0.22%) of bromide anion from at least one bromide containing compound, D) about 0.5% to about 5% (e.g. about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation).

In some embodiments, the aqueous etching composition contains A) about 60% to about 95% (e.g., about 60% to about 90%, about 60% to about 85%, about 60% to about 80%, 60% to about 75%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.1% to about 20% (e.g., about 0.5% to about 10%, about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter.

In some embodiments, the aqueous etching composition contains A) about 60% to about 95% (e.g., about 60% to about 90%, about 60% to about 85%, about 60% to about 80%, 60% to about 75%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.1% to about 20% (e.g., about 0.5% to about 10%, about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter and the chloride and bromide contents meet the following equation:

$$[Cl^-]=[-0.221]\times[Br^-]+b,$$

in which [Cl⁻] refers to the chloride content in the unit of moles/liter, [Br⁻] refers to the bromide content in the unit of moles/liter, and b is a number ranging from $0.65 \times 10^{-2}$ moles/liter to $1.285 \times 10^{-2}$ moles/liter.

In some embodiments, the aqueous etching composition contains A) about 60% to about 90% (e.g., about 60% to about 85%, about 60% to about 80%, 60% to about 75%, about 65% to about 90%, about 65% to about 80%, about 70% to about 90%, or about 70% to about 80%) of at least one sulfonic acid (e.g., methane sulfonic acid and/or p-toluene sulfonic acid), B) 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion E) about 3% to about 37% (e.g., about 10% to about 35% or about 15 to about 35% or about 20 to about 35%) water, and F) corresponding counter ions for the chloride, bromide and nitrate anions (or nitrosyl cation, in which the total chloride and bromide contents are from about $1.1 \times 10^{-2}$ moles/liter to about $3.5 \times 10^{-2}$ moles/liter.

In some embodiments, the aqueous etching composition contains A) about 60% to about 90% (e.g., about 60% to about 85%, about 60% to about 80%, 60% to about 75%, about 65% to about 90%, about 65% to about 80%, about 70% to about 90%, or about 70% to about 80%) of at least one sulfonic acid (e.g., methane sulfonic acid and/or p-toluene sulfonic acid), B) 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion E) about 3% to about 37% (e.g., about 10% to about 35% or about 15 to about 35% or about 20 to about 35%) water, and F) corresponding counter ions for the chloride, bromide and nitrate anions (or nitrosyl cation), in which the total chloride and bromide content is from about $1.1 \times 10^{-2}$ moles/liter to about $3.5 \times 10^{-2}$ moles/liter and the chloride and bromide contents meet the following equation:

$$[Cl^-]=[-0.221] \times [Br^-]+b,$$

in which $[Cl^-]$ refers to the chloride content in the unit of moles/liter, $[Br^-]$ refers to the bromide content in the unit of moles/liter, and b is a number ranging from $0.65 \times 10^{-2}$ moles/liter to $1.285 \times 10^{-2}$ moles/liter.

In some embodiments, the aqueous etching composition contains A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.035% (e.g., about 0.01% to about 0.035%, or about 0.01% to about 0.03%) of chloride anion from at least one chloride containing compound, C) about 0.05% to about 0.27% (e.g., about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter.

In some embodiments, the aqueous etching composition contains A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.035% (e.g., about 0.01% to about 0.035%, or about 0.01% to about 0.03%) of chloride anion from at least one chloride containing compound, C) about 0.05% to about 0.27% (e.g., about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter and the chloride and bromide contents meet the following equation:

$$[Cl^-]=[-0.221] \times [Br^-]+b,$$

in which $[Cl^-]$ refers to the chloride content in the unit of moles/liter, $[Br^-]$ refers to the bromide content in the unit of moles/liter, and b is a number ranging from $0.65 \times 10^{-2}$ moles/liter to $1.285 \times 10^{-2}$ moles/liter.

As used herein, the phrase "consisting essentially of" limits an etching composition to the specified materials A)-F) mentioned above and the materials that do not materially affect the basic and novel characteristics of the composition, i.e., effectively etching a metal film (e.g., a NiPt film) without significantly etching/oxidizing an adjacent material (e.g., Al or NiPtSi). For example, the materials that do not materially affect the basic and novel characteristics of the composition can include an additive (e.g., solvents, carboxylic acids or other complexing agents, viscosity reducing agents, and surfactants).

In some embodiments, the aqueous etching composition consists essentially of A) about 60% to about 95% (e.g., about 60% to about 90%, about 60% to about 85%, about 60% to about 80%, 60% to about 75%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.1% to about 20% (e.g., about 0.5% to about 10%, about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation).

In some embodiments, the aqueous etching composition consists essentially of A) about 60% to about 90% (e.g., about 60% to about 85%, about 60% to about 80%, 60% to about 75%, about 65% to about 90%, about 65% to about 80%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%)

of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation).

In some embodiments, the aqueous etching composition consists essentially of A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation).

In some embodiments, the aqueous etching composition consists essentially of A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.5% to about 5% (e.g. about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation).

In some embodiments, the aqueous etching composition consists essentially of A) about 60% to about 95% (e.g., about 60% to about 90%, about 60% to about 85%, about 60% to about 80%, 60% to about 75%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.1% to about 20% (e.g., about 0.5% to about 10%, about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter.

In some embodiments, the aqueous etching composition consists essentially of A) about 60% to about 95% (e.g., about 60% to about 90%, about 60% to about 85%, about 60% to about 80%, 60% to about 75%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.005% to about 0.04% (e.g., about 0.005% to about 0.035%, about 0.01% to about 0.035%, or about 0.01% to about 0.03%) of chloride anion from at least one chloride containing compound, C) about 0.03% to about 0.27% (e.g., about 0.05% to about 0.27%, about 0.05% to about 0.25%, or about 0.05% to about 0.22%) of bromide anion from at least one bromide containing compound, D) about 0.1% to about 20% (e.g., about 0.5% to about 10%, about 0.5% to about 5%, or about 0.5% to about 2.5%) of a nitrate or nitrosyl ion from at least one compound containing a nitrate or nitrosyl ion, E) about 3% to about 37% (e.g., about 10% to about 35% or about 15 to about 35% or about 20 to about 35%) water, and F) corresponding counter ions for the chloride, bromide and nitrate anions (or nitrosyl cation) and wherein the total chloride and bromide content is from about $1.1 \times 10^{-2}$ moles/liter to about $3.5 \times 10^{-2}$ moles/liter of the aqueous etching composition, in which the total chloride and bromide contents are from about $1.1 \times 10^{-2}$ moles/liter to about $3.5 \times 10^{-2}$ moles/liter and the chloride and bromide contents meet the following equation:

$$[Cl^-] = [-0.221] \times [Br^-] + b,$$

in which [Cl$^-$] refers to the chloride content in the unit of moles/liter, [Br$^-$] refers to the bromide content in the unit of moles/liter, and b is a number ranging from $0.65 \times 10^{-2}$ moles/liter to $1.285 \times 10^{-2}$ moles/liter.

In some embodiments, the aqueous etching composition consists essentially of A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.035% (e.g., about 0.01% to about 0.035%, or about 0.01% to about 0.03%) of chloride anion from at least one chloride containing compound, C) about 0.05% to about 0.27% (e.g., about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter.

In some embodiments, the aqueous etching composition consists essentially of A) about 60% to about 85% (e.g., about 60% to about 80%, 60% to about 75%, about 65% to about 95%, about 65% to about 80%, or about 70% to about 80%) of at least one sulfonic acid (e.g., methane sulfonic acid and/or p-toluene sulfonic acid), B) about 0.005% to about 0.035% (e.g., about 0.01% to about 0.035%, or about 0.01% to about 0.03%) of chloride anion from at least one chloride containing compound, C) about 0.05% to about 0.27% (e.g., about 0.05% to about 0.25%, or about 0.05% to about 0.22%) of bromide anion from at least one bromide containing compound, D) about 0.5% to about 10% (e.g., about 0.5% to about 5%, or about 0.5% to about 2.5%) of a nitrate or nitrosyl ion from at least one compound containing a nitrate or nitrosyl ion, E) about 10% to about 35% (e.g., about 15 to about 35% or about 20 to about 35%) water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter and the chloride and bromide contents meet the following equation:

$$[Cl^-]=[-0.221]\times[Br^-]+b,$$

in which [Cl$^-$] refers to the chloride content in the unit of moles/liter, [Br$^-$] refers to the bromide content in the unit of moles/liter, and b is a number ranging from $0.65 \times 10^{-2}$ moles/liter to $1.285 \times 10^{-2}$ moles/liter.

The pH of the etching composition described herein ranges from about −2 to about 2. A preferred pH is from about −2 to about 1.5. A more preferred pH is from about −2 to about 1. The most preferred pH is from about −2 to about 0.

Optional additives that may be employed in all embodiments to optimize performance or lower cost include solvents, carboxylic acids or other complexing agents, anti-corrosion agents, viscosity reducing agents and surfactants. The carboxylic acids can be used to improve the metal ion solubility by complimenting the chloride or bromide complexation. The surfactants may be employed to lower the surface tension of the composition for better wetting of various exposed surfaces such as aluminum, silicon dioxide, silicon nitride, silicide, tungsten, and TiN. The solvents allow modification of the Hansen solubility parameters for the solution to target some organic residue removal and change the oxidation potential of the solution. Additives employed may be mixtures of different types, mixtures of the same class of additive, or mixtures of both the same class and different types of additives. Care should be taken that the additives are stable under the low pH and oxidizing conditions.

In some embodiments, the etching composition described herein includes one or more organic solvents. In some embodiments, the organic solvents suitable for use in the etching compositions described herein exclude stabilizers such as glycols, ethers, and polyols. Examples of specific organic solvents (or stabilizer) that can be excluded from the etching composition include glyme, diglyme, triglyme, crown ethers, ethylene glycol, tripropylene glycol, and propylene glycol methyl ether. In some embodiments, the etching composition can include one or more the excluded solvents described above. In some embodiments, the etching composition does not include any organic solvent. For the purposes of this disclosure, the sulfonic acids are not considered an organic solvent.

Concentration of the additives may depend on the effectiveness or purpose of the specific additive. The concentration of additional solvents that may be employed can be from about 3% to about 35%. The concentration of carboxylic acids, other chelating agents, viscosity reducing agents, and surfactants can be from about 0.001% to about 10%.

In some embodiments, the formulation is mixed and stored for a period of time before use. In some embodiments, the formulation is formed by mixing the components and is used immediately after the formulation is formed. In some embodiments, the components are divided between one or more of a Formulation A, a Formulation B, and optionally a Formulation C. Formulation A and B and optional Formulation C are mixed to produce an aqueous etching composition of this disclosure.

Another aspect of this disclosure features a kit containing two, or optionally three, containers containing the ingredients (a Formulation A, a Formulation B, and optionally a Formulation C), when mixed in the proper proportions, yield a composition of this disclosure. In some embodiments, this disclosure concerns a kit containing, in two or optionally, three containers, the following reagents for forming an etching composition for microelectronic device manufacture: a) at least one sulfonic acid, b) at least one chloride containing compound, c) at least one bromide containing compound, d) at least one compound containing a nitrate or nitrosyl ion or mixtures thereof, and e) water, with the proviso that the at least one nitrate anion or nitrosyl cation is in a different container than the at least one chloride containing compound and the at least one bromide containing compound.

In one aspect of this disclosure, the kit contains at least one chloride containing compound in a first container, at least one compound containing a nitrate or nitrosyl ion in a second container, and at least one bromide containing compound in a third container. The second container is different from the first and third containers. In some embodiments, the first container can be same as the third container such that the at least chloride containing compound and the at least one bromide containing compound are in the same container. In other embodiments, the first container is different from the third container. In some embodiments, the first, second, or third container can include at least one sulfonic acid.

In some embodiments, this disclosure concerns a kit comprising, in two, or optionally three, containers, compositions that, when mixed, form an aqueous etching composition described herein for microelectronic device manufacture. Such an aqueous etching composition can contain A) about 60% to about 95% of at least one sulfonic acid, B) about 0.005% to about 0.04% of chloride anion from at least one chloride containing compound, C) about 0.03% to about 0.27% of bromide anion from at least one bromide containing compound D) about 0.1% to about 20% of nitrate or nitrosyl ion from at least one compound containing a nitrate or nitrosyl ion, E) about 3% to about 37% water, and F) corresponding counter ions for the chloride, bromide and nitrate anions (or nitrosyl cation).

In some embodiments, this disclosure concerns a kit comprising, in two, or optionally three, containers, compositions that, when mixed, form an aqueous etching composition described herein for microelectronic device manufacture. Such an aqueous etching composition can contain A) about 60% to about 95% of at least one sulfonic acid, B) about 0.005% to about 0.04% of chloride anion from at least one chloride containing compound, C) about 0.03% to about 0.27% of bromide anion from at least one bromide containing compound D) about 0.1% to about 20% of nitrate or nitrosyl ion from at least one compound containing a nitrate or nitrosyl ion, E) about 3% to about 37% water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter.

In some embodiments, this disclosure concerns a kit comprising, in two, or optionally three, containers, compositions that, when mixed, form an aqueous etching composition described herein for microelectronic device manufacture. Such an aqueous etching composition can contain A) about 60% to about 95% of at least one sulfonic acid, B) about 0.005% to about 0.04% of chloride anion from at least one chloride containing compound, C) about 0.03% to about 0.27% of bromide anion from at least one bromide containing compound D) about 0.1% to about 20% of nitrate or nitrosyl ion from at least one compound containing a nitrate or nitrosyl ion, E) about 3% to about 37% water, and F) corresponding counter ions for the chloride, bromide and nitrate anions (or nitrosyl cation), in which the total chloride and bromide contents are from about $1.1 \times 10^{-2}$ moles/liter to about $3.5 \times 10^{-2}$ moles/liter and the chloride and bromide contents meet the following equation:

$$[Cl^-]=[-0.221]\times[Br^-]+b,$$

in which [Cl$^-$] refers to the chloride content in the unit of moles/liter, [Br$^-$] refers to the bromide content in the unit of moles/liter, and b is a number ranging from $0.65 \times 10^{-2}$ moles/liter to $1.285 \times 10^{-2}$ moles/liter.

In some embodiments, Formulation A contains the chloride and bromide anions and sulfonic acid and optionally, water, and optional ingredients. Formulation B contains the nitrate or nitrosyl ion and sulfonic acid, and optionally water and optional ingredients. Concentrations of the components of Formulation A and Formulation B are adjusted to yield the concentration desired after mixing Formulations A and B. The specific concentrations required will be dependent on the weight mixing ratio of Formulations A and B desired. Alternatively, the mixing ratios can depend on the specific concentrations chosen. A wide range of mixing ratios or concentrations may be employed, but could be limited by the amounts of specific component required for the final formulation. A 1:1 mixing ratio is convenient and generally preferred.

For example, a 100 g sample of 67.1% sulfonic acid, 0.025% HCl, 0.22% HBr, 2.5% $HNO_3$, and 30.155% water, can be obtained with a 1:1 mixing ratio with the following formulations A and B:

Formulation A: 0.025 g HCl, 0.22 g HBr, 16.155 g water, and 33.6 g sulfonic acid, Formulation B: 2.5 g $HNO_3$, 14.0 g water, and 33.5 g sulfonic acid.

The water and sulfonic acid contents in the two formulations may be adjusted somewhat but the adjustment range is limited by the low amount of water and whether or not the $HNO_3$, HCl, and HBr are introduced to the mixture as aqueous solutions.

The same 67.1% sulfonic acid, 0.025% HCl, 0.22% HBr, 2.5% $HNO_3$, and 30.155% water composition described above can be obtained using alternative formulations A and B such as those described as follows:

Formulation A: 0.025 g HCl, 0.22 g HBr, 16.155 g water, and 8.6 g sulfonic acid, Formulation B: 2.5 g $HNO_3$, 14.0 g water, and 58.5 g sulfonic acid.

Formulation A: 0.025 g HCl, 0.22 g HBr, 16.155 g water, and 58.5 g sulfonic acid, Formulation B: 2.5 g $HNO_3$, 14.0 g water, and 8.6 g sulfonic acid.

Alternatively, one of the formulations described in the preceding paragraph can contain only HCl, HBr, and water. For example, the same 67.1% sulfonic acid, 0.025% HCl, 0.22% HBr, 2.5% $HNO_3$, and 30.155% water composition described above can be obtained via mixing Formulations A and B below:

Formulation A: 0.025 g HCl, 0.22 g HBr, 9.755 g water,

Formulation B: 2.5 g $HNO_3$, 20.4 g water, and 67.1 g sulfonic acid.

The same 67.1% sulfonic acid, 0.025% HCl, 0.22% HBr, 2.5% $HNO_3$, and 30.155% water composition can also be obtained by employing the following formulations A, B, and C:

Formulation A: 0.025 g HCl, 10.155 g water, and 23.82 g sulfonic acid,

Formulation B: 2.5 g $HNO_3$, 10.0 g water, and 21.5 g sulfonic acid,

Formulation C: 0.22 g HBr, 10.0 g water, and 21.78 g sulfonic acid.

Alternatively, the same 67.1% sulfonic acid, 0.025% HCl, 0.22% HBr, 2.5% $HNO_3$, and 30.155% water composition can also be obtained by employing appropriate amounts of the following formulations A and B. The composition can be formed by mixing 1 part Formulation A and 3 parts Formulation B.

Formulation A: 0.075 g HCl, 0.66 g HBr, 15.665 g water, and 33.6 g sulfonic acid, Formulation B: 2.5 g $HNO_3$, 24.93 g water, and 55.9 g sulfonic acid.

Those skilled in the art can easily calculate the amounts of each component necessary for Formulations A and B for each different concentration or for where one of the formulations contains only nitric and water.

This disclosure additionally is concerned with a process for etching metal films. The metal films to be etched include the Noble metals (e.g., Pt, Au, Pd, Ir, Ni, Mo, Rh, and Re), Lanthanide metals (e.g., Erbium, Gadolinium, Ytterbium, Yttrium, Holmium, and Dysprosium), and alloys (e.g. NiPt (3-20%)) thereof. The etching composition described herein can be used to etch films containing metals at different amounts. For example, the etching composition can be used to etch a metal film containing at least about 3% (e.g., at least about 5%, at least about 7%, or at least about 10%) Pt and/or at most about 20% (e.g., at most about 17%, at most about 15%, at most about 13%, at most about 11%, or at most about 10%) Pt.

Materials likely to be integrated into advanced integrated circuit design and exposed to the etching composition which are not desired to be etched include high-k materials (e.g., $HfO_2$, HfON, and HfSiON), Metal Gate Materials (e.g., TiN, TaN, TiAlN, W, WN), interstitial layers (e.g., $Al_2O_3$ and $La_2O_5$), fill metals (e.g., aluminum and aluminum alloys), dielectrics (e.g., $Si_3N_4$ and $SiO_2$), semiconductors (e.g., p-doped and n-doped Si, Ge, SiGe, InGaAs, InAlAs, InSb, GaP, GaAs, and InP), "salicide" of the metals to be etched (e.g. NiPtSi, NiPtSiGe, NiGe, NiPtGe, and NiInSb, NiInGaAs). The etch compositions and processes of this disclosure should be optimized in order to cause minimal or no damage to these films but yet remove the undesired metal (e.g., NiPt).

In some embodiments, the metal etching process described herein concerns the etching of nickel and/or nickel alloys (e.g., a nickel platinum alloy). In some embodiments, the process described herein concerns the etching of nickel platinum in the presence of Al films and/or nickel platinum silicides.

In some embodiments, the metal etching process described herein includes etching a metal film on a semiconductor substrate with an etching composition described herein; and rinsing the etched metal film with a rinse solvent. In some embodiments, the method can include (a) providing a semiconductor substrate having a metal film; (b) contacting the metal film with an etching composition of this disclosure, and (c) rinsing the etched semiconductor substrate with a solvent (e.g., a solvent containing water). The metal film can be either partially or completely exposed to the etching composition.

The etching composition can be brought into contact with the semiconductor substrate by any suitable means known to those skilled in the art. Such means include, but are not limited to, immersing the semiconductor substrate in a bath of the etching composition, or spraying or streaming the etching composition onto the semiconductor substrate. The spraying or streaming of the etching composition can terminate once the substrate is covered with the etching composition, or can continue for a portion or all of the time the etching composition is in contact with the semiconductor substrate. Typically the semiconductor substrate and the etching composition can be brought fully into contact in a few seconds. Depending on the specific process, additional etchant may be applied during the etch period or consistently throughout the period.

During the etch period, the process can include or exclude means of agitation. For example, in an immersion embodiment of the process, the etch solution may be circulated or stirred. Alternatively, the substrate can be rotated or moved up and down during the etch. In streaming or spraying embodiments of the process where the semiconductor substrate is positioned horizontally, the substrate can be rotated horizontally. In any of the embodiments, the semiconductor substrate can be vibrated to induce agitation. Those skilled in the art can determine optimum combinations of contacting and agitation means for the specific application.

The etch period typically can run from approximately 30 seconds to about 30 minutes. The time will depend on the thickness of the film being etched, the necessity to avoid deleterious effects on other exposed films, the particular etch composition being employed, the specific contacting means being employed and the temperature employed.

The temperature at which the metal film is etched is typically between 25° C. and 60° C. A preferred temperature range is from about 25° C. to about 50° C. The most preferred temperature range is from about 30° C. to about 50° C. Alternatively, the temperature range can be from about 25° C. to about 80° C. or from about 30° C. to about 70° C.

Subsequent to the etching step, the semiconductor substrate can be rinsed with an aqueous solvent containing water, preferably deionized water. Any suitable method of rinsing may be employed. Examples include immersion of the semiconductor substrate in stagnant or flowing water, or spraying or streaming water onto the semiconductor substrate. Agitation as described above during the etch period may be employed.

The aqueous solvent may include additional water soluble organic solvents. If employed, the organic solvent can assist in removing organic residues or speed up drying.

Subsequent to the rinsing step, in an optional step, the drying of the semiconductor substrate may be accelerated using a drying means. Examples of drying means include spraying with a non-oxidizing gas such as nitrogen gas, spinning the substrate, or baking on a hot plate or in an oven.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a stir bar at 200 rpm unless otherwise noted.

General Procedure 1

Formulation Blending

Samples of etch/etchant compositions were prepared by adding, while stirring, to the calculated amount of ultra-pure deionized water (DI water) at least one chloride ion source, at least one bromide ion source, at least one sulfonic acid and at least one nitrate ion or nitrosyl source. After a uniform solution was achieved, optional additives (except optional pH adjusting agents), if used, were added. The solution was allowed to equilibrate and the pH of the etch/etchant composition was taken, if needed.

The pH measurements, if needed, were taken at ambient temperature after all components were fully dissolved. All components used were commercially available and of high purity.

General Procedure 2

Etch Test in Beaker

The blanket wafer films of NiPt were diced into test coupons. Typically, on the top of NiPt layer, there can be a TiN cap with thickness of around 50-100 Å which can be removed by standard SC1 solution (1:1:5 part in volume 29% $NH_4OH$: 30% $H_2O_2$: $H_2O$) at room temperature for around 10 minutes prior to etch test. The test coupons were held using 4" long plastic locking tweezers, whereby the coupon could then be suspended into a 500 ml volume glass beaker containing approximately 200 ml of the etching compositions of the present disclosure. Prior to immersion of the coupon into an etch composition, the composition was pre-heated to the selected test condition temperature of 60° C.; within the recommended range of 30-80° C. under controlled stirring. The etch tests were then carried out by placing the coupon into the heated composition in such a way that the NiPt layer containing side of the coupon faced the stir bar. The coupon was left static in the etching composition for a period until all the film was removed visually (time to clear method).

General Procedure 3

Materials Compatibility Test in Beaker

The blanket TiN on 5000 Å silicon oxide on silicon substrate, NiPtSi and NiPtSiGe on silicon substrate, and pure Al metal on 5000 Å $SiO_2$ on silicon substrate wafers were diced into approximately 1 inch×1 inch square test coupons for the materials compatibility tests. The test coupons were initially measured for thickness or sheet resistance by the 4-point probe, CDE Resmap 273 for metallic film, or by Elipsometry for ceramic film using a Woollam M-2000x. The test coupons were then held using 4" long plastic locking tweezers, whereby the coupon could then be suspended into a 500 ml volume glass beaker containing approximately 200 ml of the etching compositions of the present disclosure. Due to the reactive nature of the compositions, they may also be formulated into two components that would be mixed together and then heated at point of use (or heated and then mixed with optional heating at point of use) to give the final etching composition. This type of partitioning of the composition is done to separate the reactive chloride and bromide components from the nitrate component to improve shelf and storage life of the etching solutions.

Prior to immersion of the coupon into an etch composition, the composition was pre-heated to the test condition temperature of 60° C. with controlled stirring. The materials compatibility tests were then carried out by placing the coupon (which was held by the plastic tweezers) into the heated composition in such a way that the TiN, NiPtSi, NiPtSiGe, TiN, or pure Al layer containing side of the coupon faced the stir bar. The coupon was left static in the etch composition for a period of 2 minutes while the composition was kept at the test temperature under controlled stirring. After the coupon was exposed in the composition for the duration of the test, the coupon was quickly removed from the etching composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. The coupon was then immediately exposed to a nitrogen gas stream from a hand held nitrogen blowing gun which caused any droplets on the coupon surface to be blown off the coupon, and further to completely dry the coupon surface. Following this final nitrogen drying step, the coupon was removed from the plastic tweezers holder and placed into a covered plastic carrier with the TiN, NiPtSi, NiPtSiGe and pure Al side up for short term storage no greater than about 2 hours. The post-thickness or sheet resistance was then collected on the post-processing test coupon surface by the 4-point probe, CDE Resmap 273 or by Elipsometry for dielectric/ceramic film using a Woollam M-2000X.

The tests described in General Procedures 2 and 3 can be used to measure the etch rates of NiPt films by an etching composition and the effect of the etching composition on other materials (e.g., Al, NiPtSi, NiPtSiGe and TiN) typically present in a device patterned with NiPt films, such as that shown in FIG. 1.

Comparative Formulation Examples CFE1-CFE6 and Formulation Examples FE1-FE4

Etching compositions CFE1-CFE6 and FE1-FE4 were prepared using General Procedure 1 and are shown in Table 1.

TABLE 1

Etching Compositions

| Solution # | Halide Source | | | Total halide $10^{-2}$ [mol/l] | Nitrate Source Nitric acid (wt %) | Sulfonic Acid 1 MSA (wt %) | Sulfonic Acid 2 p-TSA (wt %) | Water (wt %) |
| --- | --- | --- | --- | --- | --- | --- | --- | --- |
| | HCl (wt %) | HBr (wt %) | HI (wt %) | | | | | |
| CFE1 | 0.05 | | | 1.35 | 2.50 | 67.30 | | 30.15 |
| CFE2 | 0.050 | | | 1.35 | 2.50 | 65.30 | 2.00 | 30.15 |
| CFE3 | 0.025 | | | 0.68 | 2.50 | 65.30 | 2.00 | 30.175 |
| CFE4 | | 0.110 | | 1.35 | 2.50 | 65.20 | 2.00 | 30.19 |
| CFE5 | | | 0.17 | 1.35 | 2.50 | 65.18 | 2.00 | 30.15 |
| CFE6 | 0.200 | 0.440 | | 11.2 | 2.50 | 66.70 | | 30.16 |
| FE1 | 0.025 | 0.055 | | 1.35 | 2.50 | 67.20 | | 30.22 |
| FE2 | 0.025 | 0.055 | | 1.35 | 2.50 | 65.21 | 2.00 | 30.21 |
| FE3 | 0.025 | 0.110 | | 2.03 | 2.50 | 65.20 | 2.00 | 30.165 |
| FE4 | 0.025 | 0.220 | | 3.4 | 2.50 | 65.10 | 2.00 | 30.155 |

Notes:
All components shown in Table 1 are listed on a 100% weight basis unless otherwise noted. Components were added as aqueous solutions. p-TSA is p-toluenesulfonic acid. MSA is methane sulfonic acid.

Comparative Examples C1-C6 and Examples 1-4

NiPt etch tests were performed as outlined in General Procedure 2. The compatibility tests for aluminum, NiPtSi, NiPtSiGe and TiN were measured on commercial blanket wafers; two types of NiPtSiGe made by different rapid thermal anneal conditions were used. These materials compatibility tests were performed as outlined in General Procedure 3. Substrate chips were immersed into the etch compositions heated to 60° C. for a sufficient time to clear for NiPt etch tests and for 2 minutes for Aluminum, NiPtSi, NiPtSiGe and TiN tests. Etch efficiency was gauged by the etch rate of NiPt and Aluminum, NiPtSi, NiPtSiGe and TiN loss by either etch rate (A/min) or resistance change (ohms/sq.) of the film. Results are given in Table 2.

The results in Table 2 show that the Al and TiN etch rates are relatively unaffected by the range of compositions in this disclosure. It also indicates through comparative formulations CFE1 and CFE2 that there is significant room to further lower the oxidation of NiPtSi and NiPtSiGe. However, lowering the chloride content (see formulation CFE3) or changing chloride to equimolar bromide or iodide (see formulations CFE4 and CFE5), while decreasing the oxidation of NiPtSiGe, drastically lowers the NiPt etch rate to unacceptable values. Surprisingly, it was found that a mixture of chloride and bromide could provide similar (FE1 and FE2) or even increased (FE3 and FE4) NiPt etch rates while decreasing the amount of NiPtSi and NiPtSiGe oxidation simultaneously.

As showing in Table 2, adding a second sulfonic acid to an etching composition has a significant effect to decrease the oxidation of NiPtSi but a much milder effect on NiPtSiGe. See CFE1 vs CFE2 and FE1 vs FE2. These results illustrate the difference in oxidative behavior between NiPtSi and NiPtSiGe and the difficulty in obtaining decreased oxidation on both NiPtSi and NiPtSiGe simultaneously.

TABLE 2

NiPt Etch Rate, NiPtSi, NiPtSiGe, Al and TiN Compatibility Results for Formulations CFE1-CFE6 and FE1-FE4.

| Example | Solution # | Etching NiPt ER* Å/min | Oxidation | | | Metal Compatibility | |
| --- | --- | --- | --- | --- | --- | --- | --- |
| | | | NiPtSi ohm/sq | NiPtSiGe #1 ohm/sq | NiPtSiGe #2 ohm/sq | pure Al Å/min | TiN Å/min |
| C1 | CFE1 | 1392 | 24.8 | 10.2 | 2.1 | NA | NA |
| C2 | CFE2 | 1221 | 15.5 | 10.1 | 2.3 | 8.9 | 0.1 |
| C3 | CFE3 | 523 | NA | NA | 1.1 | NA | NA |
| C4 | CFE4 | 591 | NA | 2.8 | NA | NA | NA |
| C5 | CFE5 | 0 | NA | 2.7 | NA | NA | NA |
| C6 | CFE6 | 2727 | 29.1 | 17.8 | NA | 10.2 | 0 |
| 1 | FE1 | 1127 | 17.1 | 6.5 | 1.1 | NA | NA |
| 2 | FE2 | 1080 | 11.6 | 5.4 | 1.2 | 7.6 | 0.1 |
| 3 | FE3 | 1324 | NA | NA | 1.3 | NA | NA |
| 4 | FE4 | 1544 | NA | NA | 1.6 | NA | NA |

All coupons processed at 60° C. at 2 min process time except for NiPt which was processed for amount of time needed to clear the film (time to clear method).

Examples 5-16

Formulation Examples 5-16 are prepared according to General Procedure 1. The composition of this formulation is summarized in Table 3 below.

TABLE 3

Etching Composition

| Solution # | Halide Source Cl (g) | Halide Source Br (g) | Total halide $10^{-2}$ [mol/l] | Nitrate Source | Sulfonic Acid 1 | Sulfonic Acid 2 | Water (g) |
|---|---|---|---|---|---|---|---|
| FE5 | HCl (0.047) | KBr (0.155) | 2.6 | $HNO_3$ (2.49) | MSA (67.405) | 0 | 29.903 |
| FE6 | $NH_4Cl$ (0.007) | $NH_4Br$ (0.328) | 3.47 | $HNO_3$ (20) | $EtSO_3H$ (60) | 0 | 19.67 |
| FE7 | HCl (0.01) | $Me_4NBr$ (0.381) | 2.75 | $Me_4NO_3$ (4.61) | benzene sulfonic (60) | 0 | 35 |
| FE8 | $Me_4NCl$ (0.06) | HBr (0.2) | 3 02 | $HNO_3$ (10) | $EtSO_3H$ (81.74) | dodecylbenzene sulfonic (3) | 5 |
| FE9 | HCl (0.015) | HBr (0.15) | 2.26 | $Et_3NH^+$ $NO_3^-$ (10) | MSA (67.84) | Naphthalene-sulfonic (2) | 20 |
| FE10 | diphenylamine hydrochloride (0.169) | phenylamine hydrobromide (0.215) | 2.06 | $HNO_3$ (1) | MSA (61.62) | $CF_3SO_3H$ (2) | 35 |
| FE11 | HCl (0.015) | HBr (0.1) | 1.65 | $NH_4NO_3$ (5) | MSA (62.89) | Octanesulfonic acid (2) | 30 |
| FE12 | HCl (0.03) | HBr (0.2) | 3.29 | $NO^+BF_4^-$ (5) | CF3SO3H (64.77) | | 30 |
| FE13 | HCl (0.015) | Pyridine hydrobromide (0.148) | 1.34 | $HNO_3$ (2.5) | MSA (84.34) | $CF_3CF_2OCF_2CF_2SO_3H$ (3) | 10 |
| FE14 | Pyridine hydrochloride (0.127) | HBr (0.03) | 1.47 | $HNO_3$ (3) | MSA (77.57) | benzene sulfonic (4) | 15 |
| FE15 | $NH_4Cl$ (0.007)/ HCl (0.015) | HBr (0.2) | 3.01 | $HNO_3$ (2.5) | MSA (70.27) | toluenesulfonic (2) | 25 |
| FE16 | HCl (0.02) | $NH_4Br$ (0.164)/HBr (0.1) | 3.46 | $HNO_3$ (2.0) | MSA (70.72) | toluenesulfonic (2) | 25 |

NiPt etching experiments are carried out according to General Procedures 2 and 3 using FE5-FE16. NiPt metal is etched at an acceptable rate with low oxidation of NiPtSi or NiPtSiGe.

What is claimed is:

1. An etching composition, comprising:
   about 60% to about 95% of at least one sulfonic acid;
   about 0.005% to about 0.04% of chloride anion;
   about 0.03% to about 0.27% of bromide anion;
   about 0.1% to about 20% of nitrate or nitrosyl ion; and
   about 3% to about 37% of water.

2. The composition of claim 1, wherein the at least one sulfonic acid comprises a compound of formula (1):

$$R^1SO_3H \quad (1),$$

in which $R^1$ is substituted or unsubstituted $C_1$-$C_{12}$ linear or branched alkyl, substituted or unsubstituted $C_3$-$C_{12}$ cyclic alkyl, $C_1$-$C_{12}$ linear or branched fluoroalkyl ether, or $C_3$-$C_{12}$ cyclic fluoroalkyl ether.

3. The composition of claim 2, wherein $R^1$ is $C_1$-$C_{12}$ linear or branched alkyl or $C_3$-$C_{12}$ cyclic alkyl, each of which is optionally substituted with halogen, $C_1$-$C_4$ alkyl, sulfonic acid, or phenyl optionally substituted with $C_1$-$C_4$ alkyl or hydroxy.

4. The composition of claim 3, wherein the at least one sulfonic acid is methanesulfonic acid.

5. The composition of claim 1, wherein the at least one sulfonic acid comprises a compound of formula (2):

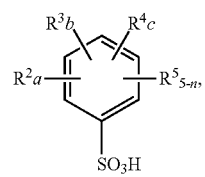

in which
   each of $R^2$, $R^3$, and $R^4$, independently, is $C_1$-$C_{12}$ linear or branched alkyl, $C_3$-$C_{12}$ cyclic alkyl, F, Cl, Br, OH, $NO_2$, $SO_3H$, or $CO_2H$;
   $R^5$ is H; and
   each of a, b, c, and n, independently, is 0, 1, 2, or 3 provided that the sum of a, b, and c is n.

6. The composition of claim 5, wherein each of $R^2$, $R^3$, and $R^4$, independently, is $C_1$-$C_2$ alkyl, $C_1$, $NO_2$, OH, F, or $CO_2H$; and n is 0 or 1.

7. The composition of claim 1, wherein the at least one sulfonic acid comprises a naphthalenesulfonic acid or anthracenesulfonic acid, each of which is optionally substituted with $C_1$-$C_{12}$ linear or branched alkyl or $SO_3H$.

8. The composition of claim 1, wherein the composition comprises a first sulfonic acid and a second sulfonic acid.

9. The composition of claim 8, wherein the first sulfonic acid comprises a compound of formula (1):

$$R^1SO_3H \qquad (1),$$

in which $R^1$ is unsubstituted $C_1$-$C_4$ linear or branched alkyl.

10. The composition of claim 8, wherein the second sulfonic acid comprises a compound of formula (2):

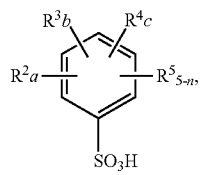

(2)

in which
each of $R^2$, $R^3$, and $R^4$, independently, is $C_1$-$C_{12}$ linear or branched alkyl, $C_3$-$C_{12}$ cyclic alkyl, F, Cl, or Br;
$R^5$ is H; and
each of a, b, c, and n, independently, is 0, 1, 2, or 3 provided that the sum of a, b, and c is n.

11. The composition of claim 8, wherein the second sulfonic acid comprises a compound of formula (1):

$$R^1SO_3H \qquad (1),$$

in which $R^1$ is substituted or unsubstituted $C_6$-$C_{12}$ linear or branched alkyl, substituted or unsubstituted $C_6$-$C_{12}$ cyclic alkyl, $C_1$-$C_{12}$ linear or branched perfluoroalkyl, $C_3$-$C_{12}$ cyclic perfluoroalkyl, $C_1$-$C_{12}$ linear or branched fluoroalkyl ether, $C_3$-$C_{12}$ cyclic fluoroalkyl ether, or substituted or unsubstituted $C_7$-$C_{12}$ alicyclic groups.

12. The composition of claim 8, wherein the second sulfonic acid comprises a naphthalenesulfonic acid or anthracenesulfonic acid, each of which is optionally substituted with $C_1$-$C_{12}$ linear or branched alkyl.

13. The composition of claim 1, wherein the composition comprises from 60% to about 90% of the at least one sulfonic acid.

14. The composition of claim 1, wherein the composition comprises at least one chloride containing compound selected from the group consisting of hydrogen chloride, ammonium chloride, a quaternary ammonium chloride, an amine hydrochloride, a nitrogen based aromatic and pseudoaromatic hydrochloride, and a metal chloride.

15. The composition of claim 14, wherein at least one chloride containing compound is hydrogen chloride, ammonium chloride, or a quaternary ammonium chloride.

16. The composition of claim 1, wherein the composition comprises from about 0.005% to about 0.035% of the chloride anion.

17. The composition of claim 1, wherein the composition comprises at least one bromide containing compound selected from the group consisting of hydrogen bromide, ammonium bromide, a quaternary ammonium bromide, an amine hydrobromide, a nitrogen based aromatic and pseudoaromatic hydrobromide, and a metal bromide.

18. The composition of claim 17, wherein at least one bromide containing compound is hydrogen bromide, ammonium bromide, or a quaternary ammonium bromide.

19. The composition of claim 1, wherein the composition comprises from about 0.05% to about 0.27% of the bromide anion.

20. The composition of claim 1, wherein the composition has a total chloride and bromide contents ranging from about $1.1 \times 10^{-2}$ moles/liter to about $3.5 \times 10^{-2}$ moles/liter.

21. The composition of claim 1, wherein the chloride and bromide contents meet the following equation:

$$[Cl^-]=[-0.221]\times[Br^-]+b,$$

in which $[Cl^-]$ is the chloride content in the unit of moles/liter, $[Br^-]$ is the bromide content in the unit of moles/liter, and b is a number ranging from $0.65 \times 10^{-2}$ moles/liter to $1.285 \times 10^{-2}$ moles/liter.

22. The composition of claim 1, wherein the composition comprises at least one compound containing a nitrate or nitrosyl ion selected from the group consisting of nitric acid, ammonium nitrate, a quaternary ammonium nitrate, a substituted ammonium nitrate, a nitrogen based aromatic and pseudoaromatic reaction product with nitric acid, a metal nitrate, nitrosyl chloride, nitrosyl bromide, nitrosyl fluoride, nitrosyl tetrafluoroborate, and nitrosyl hydrogen sulfate.

23. The composition of claim 22, wherein the at least one compound containing a nitrate or nitrosyl ion is nitric acid.

24. The composition of claim 1, wherein the composition comprises from about 0.5% to about 10% of the nitrate or nitrosyl ion.

25. The composition of claim 1, wherein the composition comprises from about 10% to about 35% of water.

26. The composition of claim 1, wherein the composition has a pH of at most about 2.

27. The composition of claim 1, wherein the composition comprises from 60% to about 90% of the at least one sulfonic acid, from about 0.005% to about 0.035% of the chloride anion, from about 0.05% to about 0.27% of the bromide anion, and from about 0.5% to about 10% of the nitrate or nitrosyl ion.

28. The composition of claim 27, wherein the composition comprises from 60% to about 85% of the at least one sulfonic acid, from about 0.01% to about 0.035% of the chloride anion, from about 0.05% to about 0.25% of the bromide anion, and from about 0.5% to about 5% of the nitrate or nitrosyl ion.

29. The composition of claim 1, wherein the composition does not include a stabilizer.

30. A method, comprising:
etching a metal film on a semiconductor substrate with the composition of claim 1; and
rinsing the etched metal film with a rinse solvent.

31. The method of claim 30, wherein the metal film is partially exposed to the composition.

32. The method of claim 30, wherein the metal film is completely exposed to the composition.

33. The method of claim 30, wherein the metal film comprises Pt, Au, Pd, Ir, Ni, Mo, Rh, Re, a lanthanide metal, or an alloy thereof.

34. The method of claim 33, wherein the metal film comprises Ni or an alloy of Pt and Ni.

35. The method of claim 30, wherein the rinse solvent comprises water.

36. A kit, comprising:
at least one chloride containing compound in a first container;
at least one compound containing a nitrate or nitrosyl ion in a second container; and
at least one bromide containing compound in a third container;
wherein the second container is different from the first and third containers.

37. The kit of claim 36, wherein the first container is the same as the third container.

38. The kit of claim 36, wherein the first container is different from the third container.

39. The kit of claim 38, wherein the first, second, or third container further comprises a sulfonic acid.

* * * * *